(12) United States Patent
Chiu

(10) Patent No.: US 8,482,265 B2
(45) Date of Patent: Jul. 9, 2013

(54) CURRENT BALANCE CIRCUIT UTILIZING MULTIPLEXERS AND TRIANGULAR WAVE GENERATORS

(75) Inventor: Yi-Guo Chiu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 155 days.

(21) Appl. No.: 13/244,712

(22) Filed: Sep. 26, 2011

(65) Prior Publication Data

US 2013/0002214 A1 Jan. 3, 2013

(51) Int. Cl.
*G05F 1/56* (2006.01)
*H03F 3/45* (2006.01)

(52) U.S. Cl.
USPC ............ 323/271; 323/283; 330/85; 330/260; 330/252; 330/259

(58) Field of Classification Search
USPC .................... 323/271, 283; 330/85, 260, 252, 330/259
See application file for complete search history.

(56) References Cited

U.S. PATENT DOCUMENTS

| 4,150,424 A | * | 4/1979 | Nuechterlein | 363/26 |
| 7,583,146 B2 | * | 9/2009 | Tam et al. | 330/260 |
| 8,030,911 B2 | * | 10/2011 | Nien et al. | 323/283 |
| 8,358,084 B2 | * | 1/2013 | Shiu et al. | 315/291 |
| 2008/0309409 A1 | * | 12/2008 | Tam et al. | 330/253 |

* cited by examiner

*Primary Examiner* — Bao Q Vu
(74) *Attorney, Agent, or Firm* — Altis Law Group, Inc.

(57) ABSTRACT

A current balance circuit includes a first branch and a second branch in parallel between a power supply unit and at least one load, which respectively include a switch. The current balance circuit detects and compares currents flowing through the first branch and the second branch. The current balance circuit also generates triangle waves and reversed triangle waves, compares voltage of a control pole of a first switch with the triangle waves, and compares voltage of the control pole of a second switch with the reversed triangle waves. Then the current balance circuit controls if the triangle waves and the reversed triangle waves are input to the first switch and the second switch according to the currents flowing through the first branch and the second branch to adjust impedance of the first switch and the second switch to balance the currents flowing through the first branch and the second branch.

8 Claims, 2 Drawing Sheets

CURRENT BALANCE CIRCUIT UTILIZING MULTIPLEXERS AND TRIANGULAR WAVE GENERATORS

BACKGROUND

1. Technical Field

The disclosure relates to power supply circuits, and particularly to a current balance circuit.

2. Description of Related Art

In high-powered power supply systems, a plurality of power supplies are connected in parallel or a power supply is divided into a plurality of current branches connected in parallel to provide high current to at least one load, which both need to balance currents. In a power supply system with the plurality of power supplies, a pulse width modulation (PWM) controller is utilized to adjust output voltage to the at least one load according to current feedback signals, to balance the currents. If the current feedback signals are obtained via resistors, the current feedback signals are easy to be influenced by common mode noises. If the current feedback signals are obtained via current Hall elements, the power supply systems have a high cost and occupy large space.

In a power supply system with a power supply divided into the plurality of current branches, impedance among the plurality of current branches often do not match. Although copper foil impedance can be used to balance currents through the plurality of current branches, the copper foil impedance is easy to be influenced by temperature and current density, which influences veracity of current balance.

DETAILED DESCRIPTION

Figure 1:
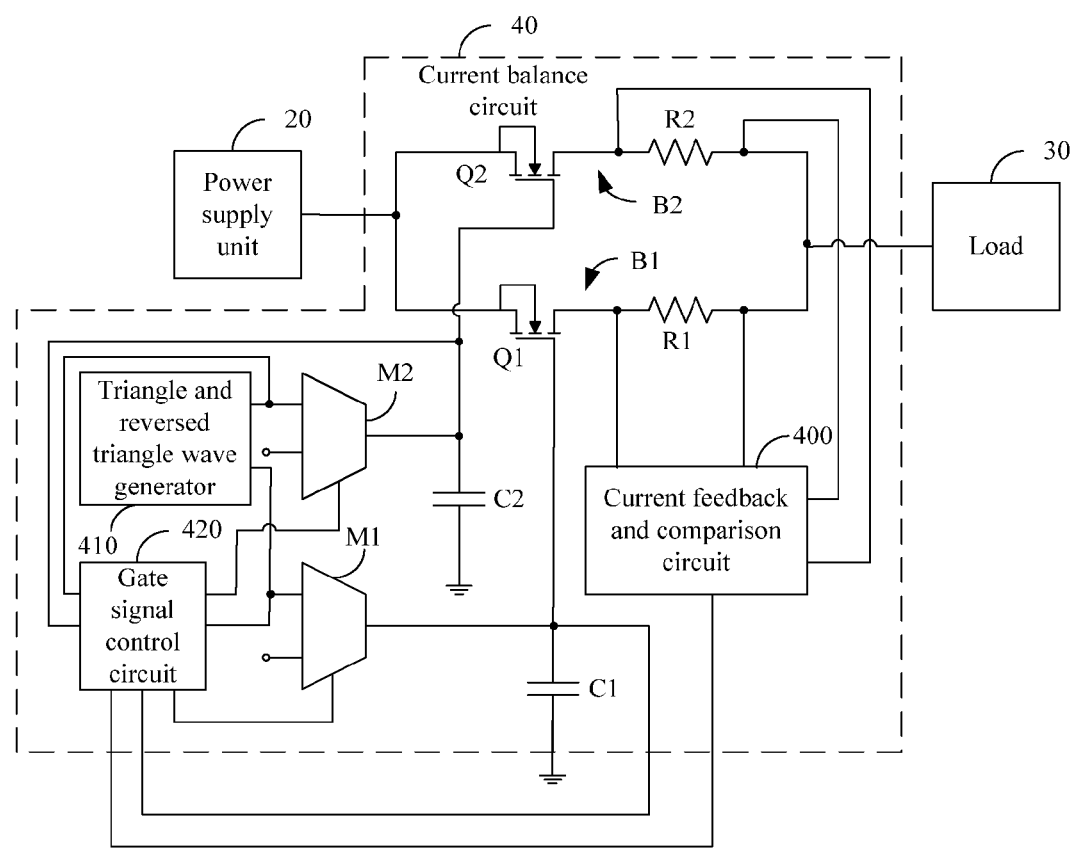
FIG. 1 is a schematic diagram of one embodiment of a current balance circuit as disclosed.

FIG. 1 is a schematic diagram of one embodiment of a current balance circuit 40 as disclosed. In one embodiment, the current balance circuit 40 is connected between a power supply unit 20 and at least one load 30, to balance currents flowing through a plurality of branches from the power supply unit 20 to the at least one load 30. The power supply unit 20 may be a power supply or a power converter unit, and the at least one load 30 may be a working circuit or a powered device. The current balance circuit 40 includes a first branch B1, a second branch B2, a current feedback and comparison circuit 400, a triangle and reversed triangle wave generator 410, a gate signal control circuit 420, a first multiplexer M1, a second multiplexer M2, a first capacitor C1, and a second capacitor C2. The first branch B1 and the second branch B2 are connected between the power supply unit 20 and the at least one load 30 in parallel. The first branch B1 includes a first switch Q1 and a first resistor R1 connected in series, and the second branch B2 includes a second switch Q2 and a second resistor R2 connected in series.

The first switch Q1 and the second switch Q2 both include a control pole, a first pole, and a second pole. The first pole of the first switch Q1 is connected to the power supply unit 20 to receive input power, and the second pole of the first switch Q1 is connected to the at least one load 30 via the first resistor R1. The first pole of the second switch Q2 is connected to the power supply unit 20 to receive the input power, and the second pole of the second switch Q2 is connected to the at least one load 30 via the second resistor R2. In one embodiment, the first switch Q1 and the second switch Q2 are P channel metal oxide semiconductor field effect transistor (P-MOSFET). The first poles of the first switch Q1 and the second switch Q2 are both sources of the P-MOSFETs, the control poles of the first switch Q1 and the second switch Q2 are both gates of the P-MOSFETs, and the second poles of the first switch Q1 and the second switch Q2 are both drains of the P-MOSFETs. Impedance of the first switch Q1 and the second switch Q2 increases while voltage of the gate of the first switch Q1 and the second switch Q2 increases. The first resistor R1 and the second resistor R2 respectively obtain currents flowing through the first branch B1 and the second branch B2.

The current feedback and comparison circuit 400 is connected to the first resistor R1 and the second resistor R2 in parallel, and detects and compares the currents flowing through the first branch B1 and the second branch B2. The triangle and reversed triangle wave generator 410 generates triangle waves and reversed triangle waves. In one embodiment, there is one-hundred eighty degree phase difference between the triangle waves and the reversed triangle waves, and the triangle and reversed triangle wave generator 410 includes a triangle wave generator and a one-hundred eighty degree degree phase shifter.

The first multiplexer M1 and the second multiplexer M2 both include a first input terminal, a second input terminal, a control terminal, and an output terminal. The first input terminal of the first multiplexer M1 receives the triangle waves, the second input terminal of the first multiplexer M1 is suspended, and the output terminal of the first multiplexer M1 outputs first control signals to the control pole of the first switch Q1 to control the first switch Q1 and is connected to the ground via the first capacitor C1. The first input terminal of the second multiplexer M2 receives the reversed triangle waves, the second input terminal of the second multiplexer M2 is suspended, and the output terminal of the second multiplexer M2 outputs second control signals to the control pole of the second switch Q2 to control the second switch Q2 and is connected to the ground via the second capacitor C2.

The gate signal control circuit 420 is connected to the current feedback and comparison circuit 400, the control poles of the first switch Q1 and the second switch Q2, the triangle and the reversed triangle wave generator 410, and the control terminals of the first multiplexer M1 and the second multiplexer M2. The gate signal control circuit 420 compares the triangle waves with voltage of the control pole of the first switch Q1, and compares the reversed triangle waves with voltage of the control pole of the second switch Q2. The gate signal control circuit 420 further control input switch of the first multiplexer M1 and the second multiplexer M2 according to the currents flowing the first branch B1 and the second branch B2, to adjust impedance of the first switch and the second switch to balance the currents flowing through the first branch M1 and the second branch M2.

In one embodiment, the triangle waves can be input to the control pole of the first switch Q1 via the first multiplexer M1, and the reversed waves can be input to the control pole of the second switch Q2. If the current flowing through one of the first branch B1 and the second branch B2 is greater than the current flowing the other one of the first branch B1 and the second branch B2, the impedance of the branch with the greater current should be increased to decrease the current flowing through the branch with the greater current. Because impedance of the first switch Q1 and the second switch Q2 increases while the voltage of the gates of the first switch Q1 and the second switch Q2 increases, the rising triangle waves or the reversed triangle waves corresponding to the branch with the greater current need to be input to the control pole of the switch of the branch with the greater current.

When the currents flow through the first branch B1 and the second branch B2 are different and the triangle waves or the reversed triangle waves corresponding to the branch with the greater current is rising, the gate signal control circuit 420 controls the first multiplexer M1 and the second multiplexer M2 switch to the first input terminals. Thus, the triangle waves and the reversed triangle waves are respectively input to the control poles of the first switch Q1 and the second switch Q2. When the currents flow through the first branch B1 and the second branch B2 are different and the triangle waves or the reversed triangle waves corresponding to the branch with the greater current is dropping, the gate signal control circuit 420 controls the first multiplexer M1 and the second multiplexer M2 switch to the second input terminals. Thus, the triangle waves and the reversed triangle waves are not input to the control poles of the first switch Q1 and the second switch Q2.

Figure 2:
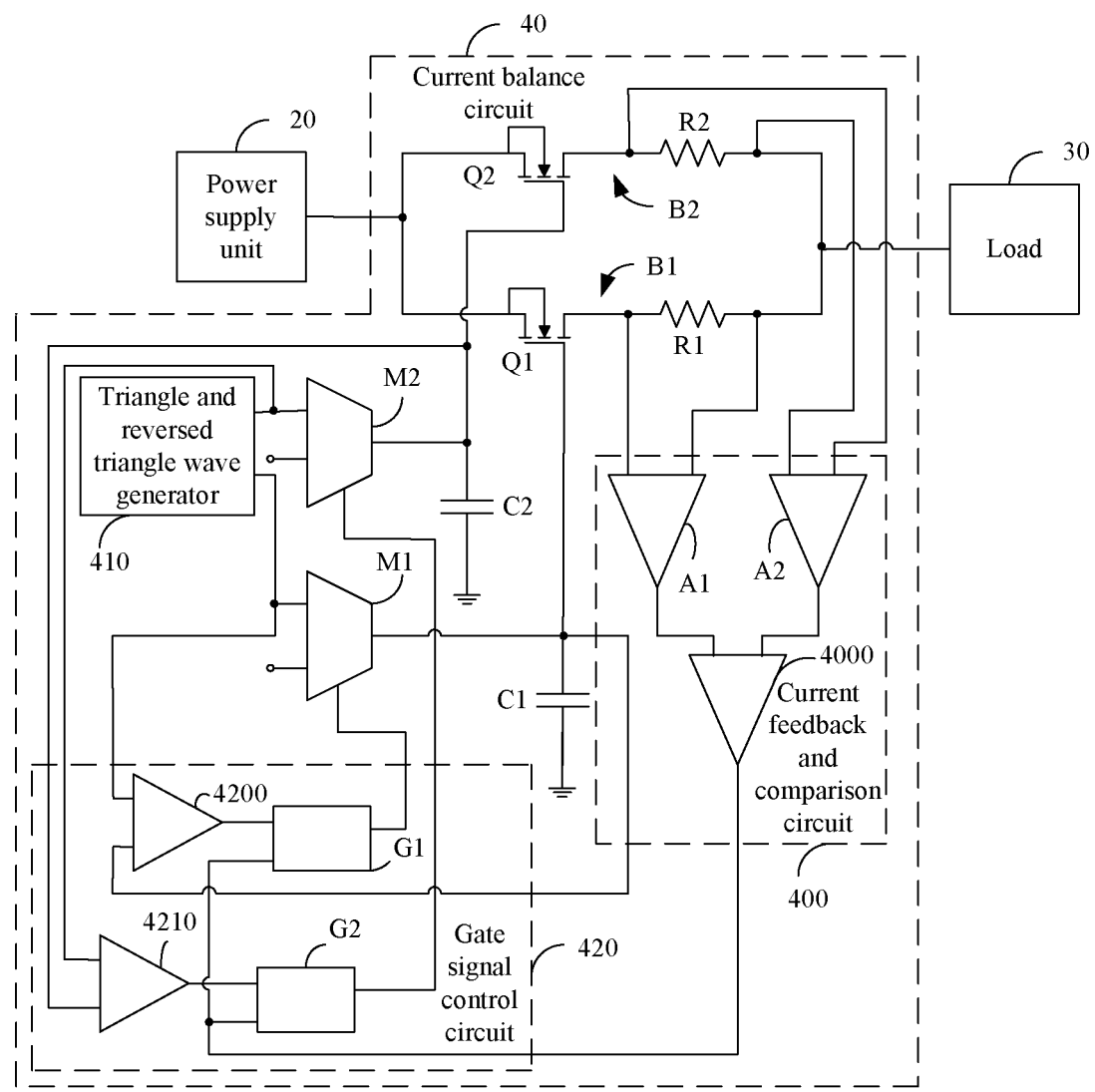
FIG. 2 is a circuit diagram of one embodiment of a current balance circuit as disclosed.

FIG. 2 is a circuit diagram of one embodiment of the current balance circuit 40 as disclosed. The current feedback and comparison circuit 400 includes a first amplifier A1, a second amplifier A2, and a first comparator 4000. The first amplifier A1 and the second amplifier A2 both include a first input terminal, a second input terminal, and an output terminal. The first comparator 4000 includes an inverting input terminal, a non-inverting input terminal, and an output terminal. The first input terminal of the first amplifier A1 is connected to one end of the first resistor R1, the second input terminal of the first amplifier A1 is connected to another end of the first resistor R1, and the output terminal of the first amplifier A1 is connected to the non-inverting input terminal of the first comparator 4000.

The first input terminal of the second amplifier A2 is connected to one end of the second resistor R2, the second input terminal of the second amplifier A2 is connected to another end of the second resistor R2, and the output terminal of the second amplifier A2 is connected to the inverting input terminal of the first comparator 4000. The first amplifier A1 and the second amplifier A2 respectively amplify current detected by the first resistor R1 and the second resistor R2. The output terminal of first comparator 4000 outputs comparison signals. In one embodiment, if the current flowing through the first resistor R1 is greater than the current flowing through the second resistor R2, the first comparator A1 outputs the comparison signals with high logic level, which may be represented by "1". If the current flowing through the first resistor R1 is lower than the current flowing through the second resistor R2, the first comparator A1 outputs the comparison signals with low logic level, which may be represented by "0".

The gate signal control circuit 420 includes a second comparator 4200, a third comparator 4210, an exclusive NOR gate G1, and an exclusive OR gate G2. The second comparator 4200 and the third comparator 4210 both include a non-inverting input terminal, an inverting input terminal, and an output terminal. The non-inverting input terminal of the second comparator 4200 is connected to the control pole of the first switch Q1, and the inverting input terminal of the second comparator 4200 receives the triangle waves. The non-inverting input terminal of the third comparator 4210 is connected to the control pole of the second switch Q2, and the inverting input terminal of the third comparator 4210 receives the reversed triangle waves.

The exclusive NOR gate G1 includes a first input terminal, a second input terminal, and an output terminal. The first input terminal of the exclusive NOR gate G1 is connected to the output terminal of the first comparator 4000, the second input terminal of the exclusive NOR gate G1 is connected to the output terminal of the second comparator 4200, and the output terminal of the exclusive NOR gate G1 is connected to the control terminal of the first multiplexer M1. The exclusive OR gate G2 also includes a first input terminal, a second input terminal, and an output terminal. The first input terminal of the exclusive OR gate G2 is connected to the output terminal of first comparator 4000, the second input terminal of the exclusive OR gate G2 is connected to the output terminal of the third comparator 4210, and the output terminal of the exclusive OR gate G2 is connected to the control terminal of the second multiplexer M2.

In one embodiment, if the current flowing through the first branch B1 is greater than the current flowing through the second branch B2, the first comparator 4000 outputs the comparison signal with high logic level. At this time, if the triangle waves are dropping and the reversed triangle waves are rising, because of buffer of the first capacitor C1 and the second capacitor C2, voltage of the triangle waves is lower than voltage of the control pole of the first switch Q1, and voltage of the reversed triangle waves is greater than voltage of the control pole of the second switch Q2. Therefore, the second comparator 4200 outputs low logic level signals represented by "0", and the third comparator 4210 outputs high logic level signals represented by "1". The exclusive NOR gate G1 output low logic level signals represented by "0", and the exclusive OR gate G2 outputs low logic level signals represented by "0". Thus, the first multiplexer M1 and the second multiplexer M2 switch to the second input terminal, that is, there is no triangle waves or reversed triangle waves input to the control poles of the first switch Q1 and the second switch Q2. The current flowing through the first branch B1 is also greater than the current flowing through the second branch B2.

If the triangle waves are rising and the reversed triangle waves are dropping, the voltage of the triangle waves are greater than the voltage of the control pole of the first switch Q1, and the voltage of the reversed triangle waves are lower than the voltage of the control pole of the second switch Q2. The second comparator 4200 outputs high logic level signals represented by "1", and the third comparator 4210 outputs low logic level signals represented by "0". The exclusive NOR gate G1 outputs high logic level signals to the control terminal of the first multiplexer M1, and the exclusive OR gate G2 outputs high logic level signals to the control pole of the second multiplexer M2. Thus, the first multiplexer M1 and the second multiplexer M2 both switch to the first input terminals, that is, the rising triangle waves are input to the control pole of the first switch Q1, and the dropping reversed triangle waves are input to the control pole of the second switch Q2. Therefore, the impedance of the first switch Q1 increases with rising voltage of the control pole, and the impedance of the second switch Q2 decreases with dropping voltage of the control pole. Thus, the currents flowing through the first branch B1 and the second branch B2 are balanced.

Similarly, if the current flowing through the first branch B1 is lower than the current flowing through the second branch B2, when the reversed triangle waves are rising, the gate signal control circuit 420 controls the first multiplexer M1 and the second multiplexer M2 switch to the first input terminals to make the triangle waves and the reversed triangle waves input into the corresponding control poles of the first switch Q1 and the second switch Q2. Therefore, the impedance of the first switch Q1 decreases while the impedance of the second switch Q2 increases, which results that the current flowing through the first switch Q1 increases and the current flowing through the second switch Q2 decreased. Thus, the currents flowing through the first branch B1 and the second branch B2 are balanced.

The current balance circuit 40 has simple structures, and adjusts the voltage of the control poles of the first switch Q1 and the second switch Q2 according to a comparison result of the currents flowing through the first switch Q1 and the second switch Q2 and a comparison result of the voltage of the control poles of the first switch Q1 and the second switch Q2 with corresponding triangle waves or reversed triangle waves. Thus, the current balance circuit 40 adjusts the impedance of the first switch Q1 and the second switch Q2 to precisely balance current flowing through the first switch Q1 and the second switch Q2, which avoids influence of temperature and current density. In addition, the current feedback and comparison circuit 400 can effectively suppress common mode noises generated in the current feedback process, which avoids interference of the common mode noises.

The foregoing disclosure of various embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto and their equivalents.

What is claimed is:

1. A current balance circuit, comprising:
   a first branch, comprising a first switch with a control pole and a first resistor connected in series between a power supply unit and at least one load;
   a second branch, comprising a second switch with a control pole and a second resistor connected in series between the power supply and the at least one load;
   a current feedback and comparison circuit, connected to the first resistor and the second resistor in parallel, to detect and compare currents flowing through the first branch and the second branch;
   a triangle and reversed triangle wave generator, to generate triangle waves and reversed triangle waves;
   a first multiplexer, comprising a first input terminal, a second input terminal, a control terminal, and an output terminal, the first input terminal receiving the triangle waves, the second input terminal being suspended, and the output terminal outputting first control signals to the control pole of the first switch to control the first switch and connected to the ground via a first capacitor;
   a second multiplexer, comprising a first input terminal, a second input terminal, a control terminal, and an output terminal, the first input terminal of the second multiplexer receiving the reversed triangle waves, the second input terminal of the second multiplexer being suspended, and the output terminal of the second multiplexer outputting second control signals to the control pole of the second switch to control the second switch and connected to the ground via a second capacitor; and
   a gate signal control circuit, connected to the current feedback and comparison circuit, the first switch, the second switch, the triangle and reversed triangle wave generator, and the control terminals of the first multiplexer and the second multiplexer, to compare voltage of the control pole of the first switch with the triangle waves, compare voltage of the control pole of the second switch with the reversed triangle waves, and to control input switch of the first multiplexer and the second multiplexer according to the currents flowing through the first branch and the second branch to adjust impedance of the first switch and the second switch to balance the currents flowing through the first branch and the second branch.

2. The current balance circuit of claim 1, wherein the first switch further comprises a first pole connected to the power supply unit and a second pole connected to the first resistor.

3. The current balance circuit of claim 2, wherein the first switch is a P channel metal oxide semiconductor field effect transistor (P-MOSFET), the control pole of the first switch is a gate of the P-MOSFET, the first pole of the first switch is a source of the P-MOSFET, and the second pole of the first switch is a drain of the P-MOSFET.

4. The current balance circuit of claim 1, wherein the second switch further comprises a first pole connected to the power supply unit and a second pole connected to the second resistor.

5. The current balance circuit of claim 4, wherein the second switch is a P channel metal oxide semiconductor field effect transistor (P-MOSFET), the control pole of the second switch is a gate of the P-MOSFET, the first pole of the second switch is a source of the P-MOSFET, and the second pole of the second switch is a drain of the P-MOSFET.

6. The current balance circuit of claim 1, wherein the current feedback and comparison circuit comprises:
   a first amplifier, comprising a first input terminal, a second input terminal, and an output terminal, the first input terminal of the first amplifier connected to one end of the first resistor, and the second input terminal of the first amplifier connected to another end of the first resistor;
   a second amplifier, comprising a first input terminal, a second input terminal, and an output terminal, the first input terminal of the second amplifier connected to one end of the second resistor, and the second input terminal of the second amplifier connected to another end of the second resistor; and
   a first comparator, comprising an inverting input terminal, a non-inverting input terminal, and an output terminal, the non-inverting input terminal connected to the output terminal of the first amplifier, the inverting input terminal connected to the output terminal of the second amplifier, and the output terminal of the first comparator outputting comparison signals.

7. The current balance circuit of claim 6, wherein the gate signal control circuit comprises:
   a second comparator, comprising an inverting input terminal, a non-inverting input terminal, and an output terminal, the non-inverting input terminal of the second comparator connected to the control pole of the first switch, and the inverting input terminal of the second comparator receiving the triangle waves;
   a third comparator, comprising an inverting input terminal, a non-inverting input terminal, and an output terminal, the non-inverting input terminal of the third comparator connected to the control pole of the second switch, and the inverting input terminal of the third comparator receiving the reversed triangle waves;
   an exclusive NOR gate, comprising a first input terminal, a second input terminal, and an output terminal, the first input terminal of the exclusive NOR gate connected to the output terminal of the first comparator, the second input terminal of the exclusive NOR gate connected to the output terminal of the second comparator, and the output terminal of the exclusive NOR gate connected to the control terminal of the first multiplexer; and
   an exclusive OR gate, comprising a first input terminal, a second input terminal, and an output terminal, the first input terminal of the exclusive OR gate connected to the output terminal of the first comparator, the second input terminal of the exclusive OR gate connected to the output terminal of the third comparator, and the output terminal of the exclusive OR gate connected to the control terminal of the second multiplexer.

8. The current balance circuit of claim 1, wherein the gate signal control circuit controls the first multiplexer and the second multiplexer switch to the first input terminals when the currents flow through the first branch and the second branch are different and the triangle waves or the reversed triangle waves corresponding to the branch with the greater current is rising, and controls the first multiplexer and the second multiplexer switch to the second input terminals when the currents flow through the first branch and the second branch are different and the triangle waves or the reversed triangle waves corresponding to the branch with the greater current is dropping.

* * * * *